(12) United States Patent
Chen et al.

(10) Patent No.: US 10,299,401 B2
(45) Date of Patent: May 21, 2019

(54) CABLE MANAGEMENT DEVICE

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chih-Hsin Yeh, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 6 days.

(21) Appl. No.: 15/485,400

(22) Filed: Apr. 12, 2017

(65) Prior Publication Data
US 2018/0063987 A1  Mar. 1, 2018

(30) Foreign Application Priority Data
Aug. 31, 2016  (TW) .............................. 105128340 A

(51) Int. Cl.
| | |
|---|---|
| H02G 3/04 | (2006.01) |
| H05K 7/14 | (2006.01) |
| F16L 3/22 | (2006.01) |
| F16L 3/015 | (2006.01) |
| H02G 11/00 | (2006.01) |

(52) U.S. Cl.
CPC ............ H05K 7/1491 (2013.01); F16L 3/015 (2013.01); F16L 3/22 (2013.01); H02G 11/006 (2013.01); *H02G 3/0456* (2013.01)

(58) Field of Classification Search
CPC .... H05K 7/1491; H05K 7/1492; H05K 7/183; F16L 3/22; F16L 3/015; H02G 11/006; H02G 3/0456
See application file for complete search history.

(56) References Cited

U.S. PATENT DOCUMENTS

| | | | | |
|---|---|---|---|---|
| 3,448,954 A * | 6/1969 | Kurlandsky | ............ | F16G 13/16 248/51 |
| 3,772,875 A * | 11/1973 | Viano | ..................... | F16G 13/16 198/851 |
| 4,392,344 A * | 7/1983 | Gordon | ................... | F16G 13/16 138/120 |
| 4,669,507 A * | 6/1987 | Moritz | ................. | H02G 11/006 138/120 |
| 5,108,350 A * | 4/1992 | Szpakowski | ............ | F16G 13/16 474/207 |
| 6,621,692 B1 * | 9/2003 | Johnson | ............... | H05K 7/1421 312/223.1 |
| 6,896,344 B2 * | 5/2005 | Tsutsumi | ............... | H02G 11/00 248/51 |
| 7,552,581 B1 | 6/2009 | Pfeifer et al. | | |
| 7,984,605 B2 | 7/2011 | Pfeifer et al. | | |
| 8,045,343 B2 * | 10/2011 | Fan | ..................... | H05K 7/1491 361/810 |

(Continued)

*Primary Examiner* — Anita M King
(74) *Attorney, Agent, or Firm* — Rosenberg, Klein & Lee

(57) ABSTRACT

A cable management device adapted for a slide rail assembly includes a first tray, a second tray, and a cable chain. The second tray is connected to the first tray in an extendable and retractable manner in order to move with respect to the first tray and thus enter a retracted state or an extended state. The cable chain is connected to the first tray.

15 Claims, 10 Drawing Sheets

(56) References Cited

U.S. PATENT DOCUMENTS

| | | | |
|---|---|---|---|
| 8,379,410 B2 * | 2/2013 | Kitten | H05K 7/1491 |
| | | | 174/69 |
| 9,070,419 B1 * | 6/2015 | Zhu | H05K 7/1491 |
| 9,370,121 B2 | 6/2016 | Chen et al. | |
| 9,480,182 B2 | 10/2016 | Chen et al. | |
| 9,763,352 B2 * | 9/2017 | Jau | G11B 33/128 |
| 10,133,302 B2 * | 11/2018 | Yuan | H05K 7/1491 |

* cited by examiner

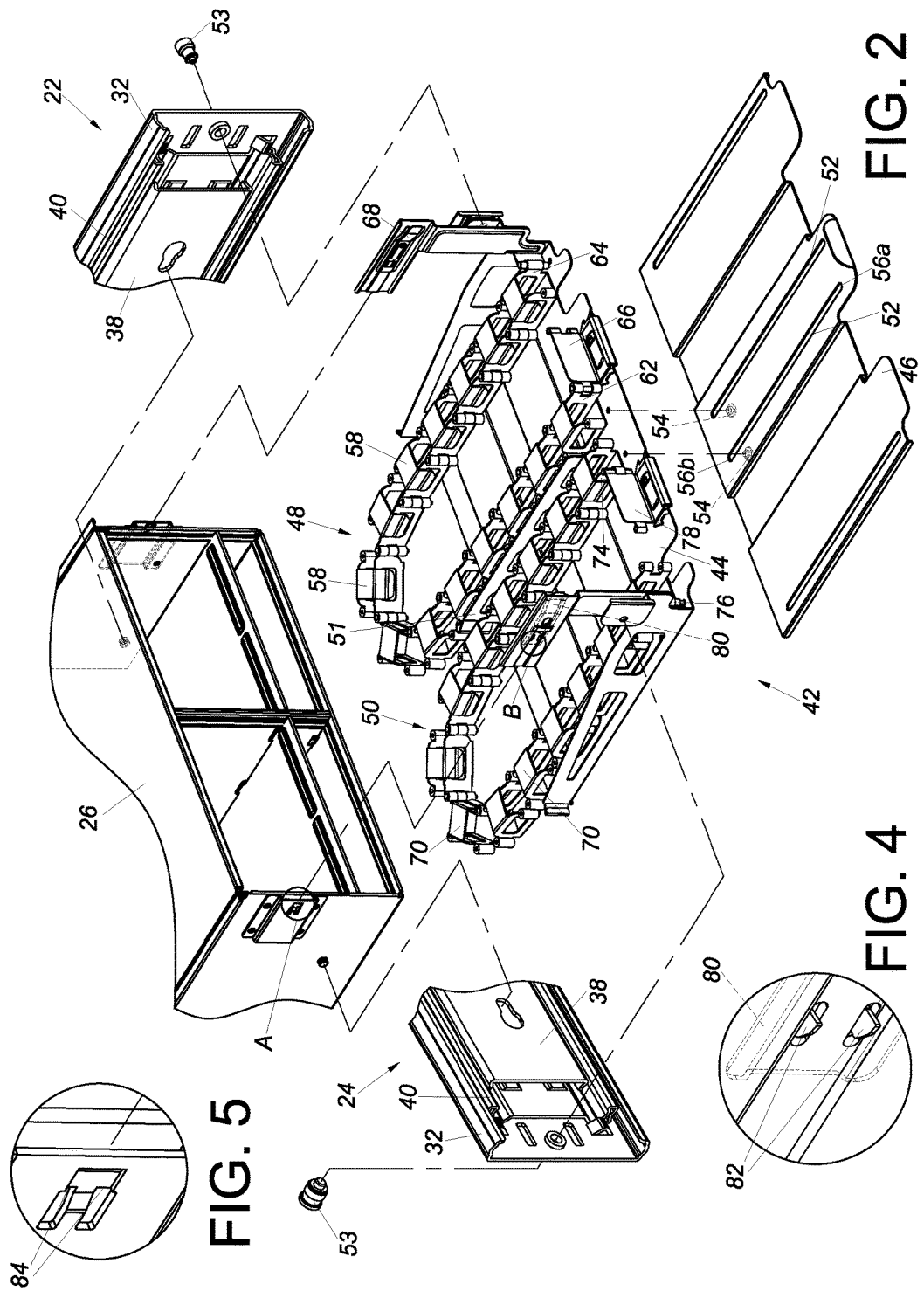

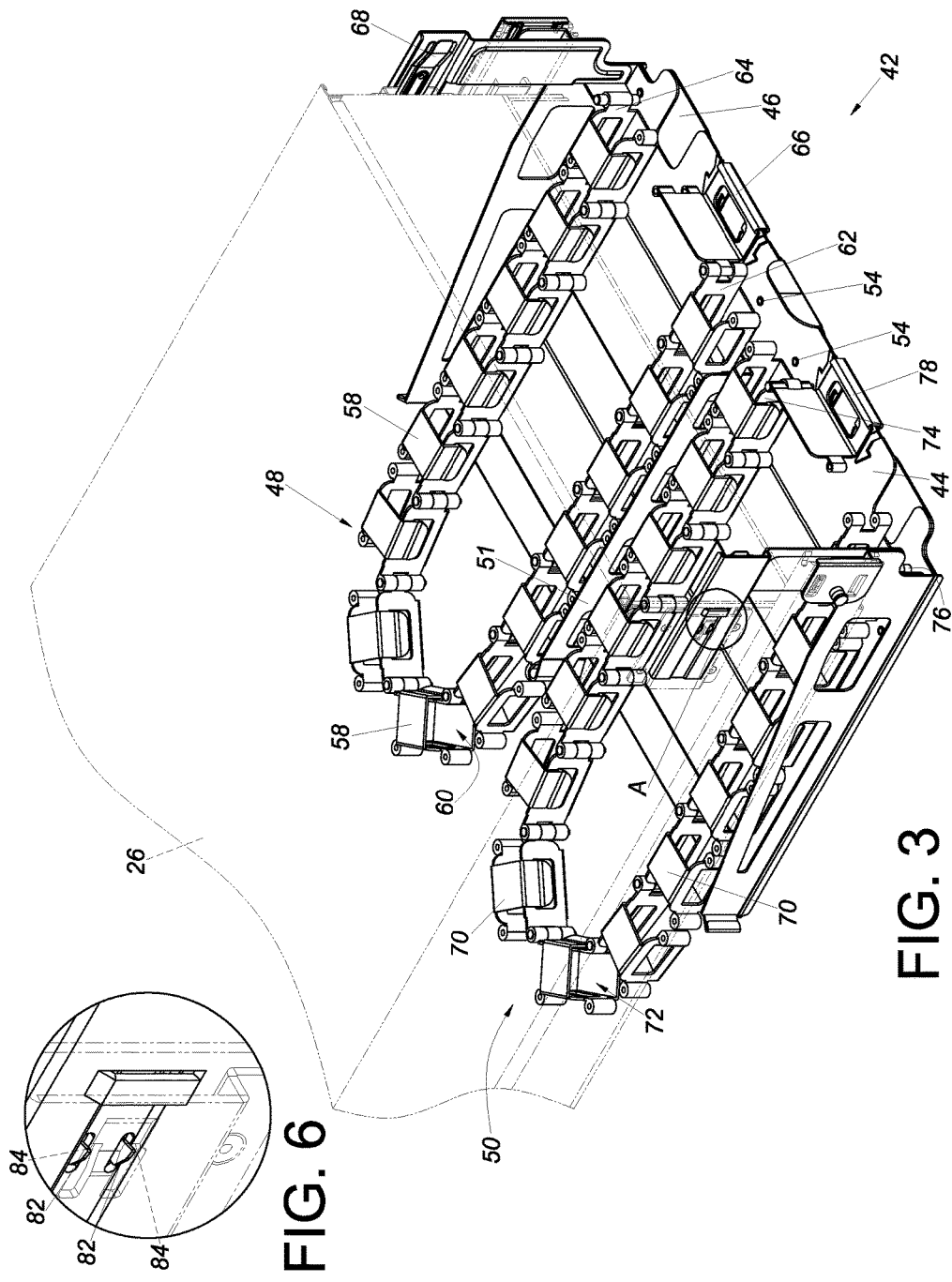

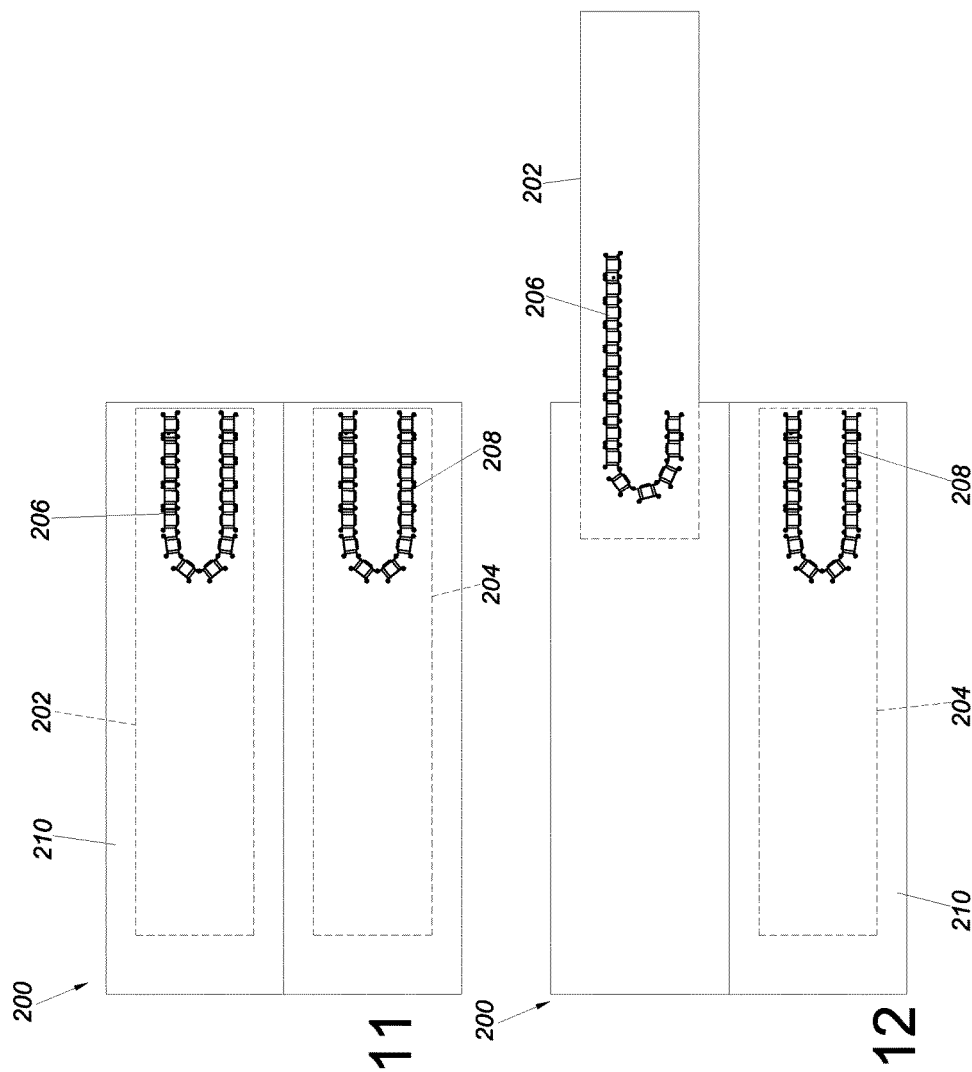

CABLE MANAGEMENT DEVICE

FIELD OF THE INVENTION

The present invention relates to a cable management device and more particularly to one applicable to a rack system or a slide rail assembly.

BACKGROUND OF THE INVENTION

Electronic equipment generally has cables. In order to arrange such cables neatly, cable management devices or assemblies were developed.

U.S. Pat. No. 7,552,581 B1, for example, discloses an articulating cable chain assembly that includes an articulated cable chain (102) with a flat spring. The flat spring is configured for initiating a first folding curve (122) that holds the articulated cable chain (102) in a tight radius. Once the first folding curve (122) is properly initiated, the remaining folding curves in the articulated cable chain (102) are folded at the proper locations.

U.S. Pat. No. 7,984,605 B2 discloses a cable chain return system (100) that includes a spring (170) for assisting folding and organization of a cable chain (110).

While the cable chains disclosed in the afore-cited patents are designed for cable arrangement, the environments in which they are to be used may have different requirements. It is therefore an important issue in the related industries to develop different cable chain products that are configured to meet specific market demands respectively.

SUMMARY OF THE INVENTION

The present invention relates to a cable management device for use in a rack system or with a slide rail assembly.

According to one aspect of the present invention, a cable management device for use with a slide rail assembly includes a first tray, a second tray, and a first cable chain. The second tray is connected to the first tray in an extendable and retractable manner in order to move with respect to the first tray and thereby enter a retracted state or an extended state. The first cable chain is connected to the first tray.

In some embodiments, the first cable chain is detachably connected to the first tray.

In some embodiments, the second tray is configured to support the first cable chain while moving with respect to the first tray from the retracted state to the extended state.

In some embodiments, the cable management device further includes a second cable chain connected to the first tray.

In some embodiments, the second tray is configured to support one of the first cable chain and the second cable chain while moving with respect to the first tray from the retracted state to the extended state.

In some embodiments, the cable management device further includes a partition on the first tray. The partition keeps the first cable chain and the second cable chain apart.

In some embodiments, the first cable chain includes a plurality of cable management units that are movably connected to one another.

In some embodiments, the cable management units are pivotally connected to one another.

Preferably, the cable management device in any of the foregoing embodiments is adapted for a slide rail assembly that includes a first rail and a second rail movable with respect to the first rail. The first tray is mountable on the first rail. The first cable chain is moved in response to the second rail moving with respect to the first rail. Furthermore, in some embodiments, the cable management device is adapted for a rack system that includes the aforesaid slide rail assembly for mounting an object to a rack, wherein the first rail is mounted on the rack while the second rail is mounted with the object, and the first tray is mountable on one of the first rail and the rack.

BRIEF DESCRIPTION OF THE DRAWINGS

FIG. 2 is an exploded perspective view of the slide rail assemblies of the rack system, the object, and the cable management device in the first embodiment of the present invention;

FIG. 3 is an assembled perspective view of the cable management device and the object in the first embodiment of the present invention;

FIG. 4 is an enlarged view of the circled area B in FIG. 2, showing that the second auxiliary member includes a first engaging feature;

FIG. 5 is an enlarged view of the circled area A in FIG. 2, showing that the object includes a second engaging feature on one side;

FIG. 6 is an enlarged view of the circled area A in FIG. 3, showing engagement between the corresponding first and second engaging features;

FIG. 11 shows that the cable management device in the second embodiment of the preset invention includes two second trays, and that the second trays are in a retracted state with respect to the first tray;

FIG. 12 shows one of the second trays in FIG. 11 pulled out to an extended state and supporting the corresponding cable chain;

DETAILED DESCRIPTION OF THE INVENTION

Figure 1:
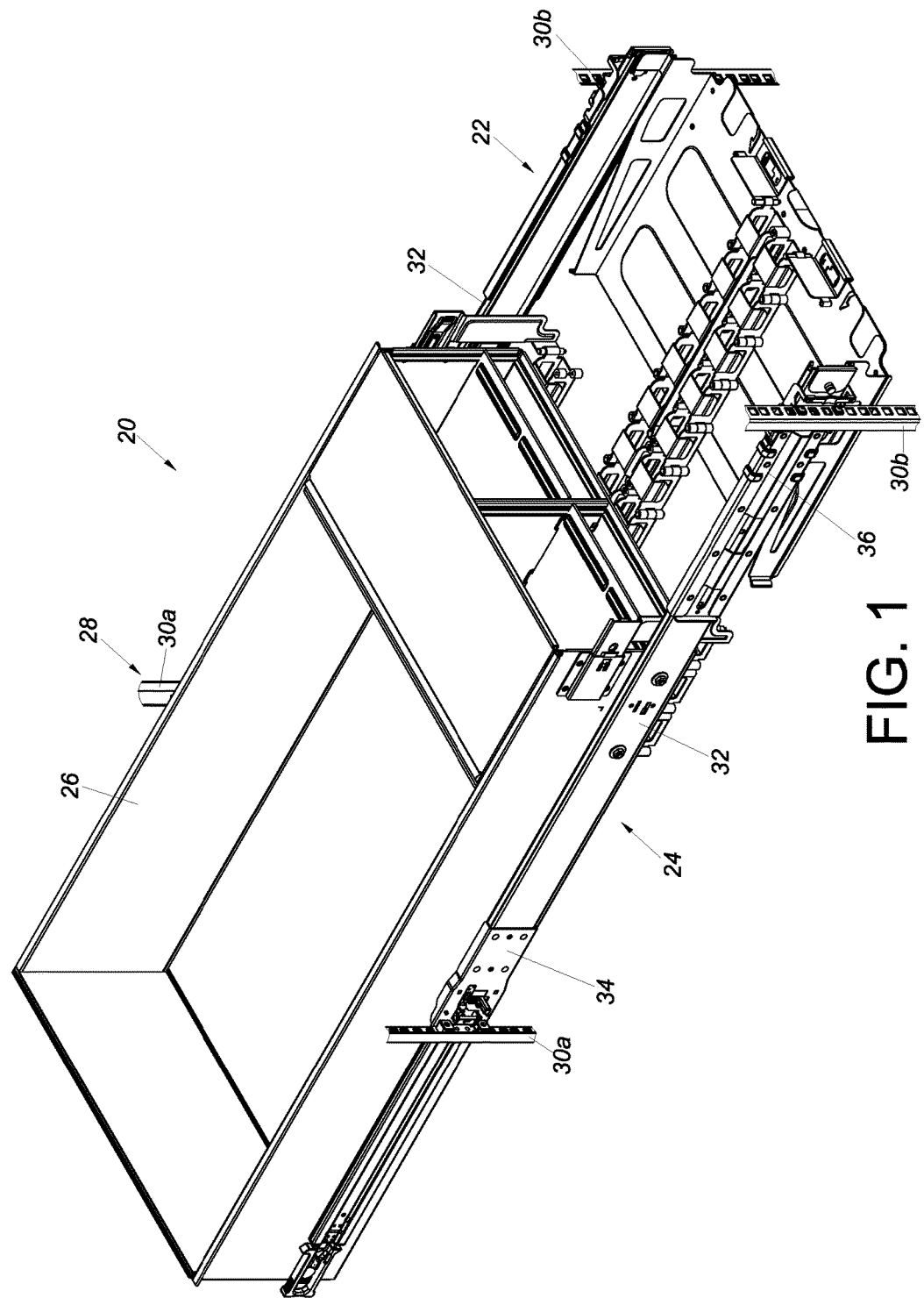
FIG. 1 is a perspective view of the rack system in the first embodiment of the present invention.

Referring to FIG. 1, a rack system 20 includes a pair of slide rail assemblies (e.g., a first slide rail assembly 22 and a second slide rail assembly 24) for mounting an object 26 to a rack 28. The object 26 may be a piece of electronic equipment, such as a server and/or a power supply. The rack 28 includes a pair of first posts 30*a* and a pair of second posts 30*b*. Each slide rail assembly 22 or 24 includes a first rail 32. Each first rail 32 has two portions respectively arranged with a first bracket 34 (e.g., a front bracket) and a second bracket 36 (e.g., a rear bracket) configured to be mounted to a corresponding one of the first posts 30*a* and a corresponding one of the second posts 30*b* of the rack 28 respectively.

As shown in FIG. 2, each slide rail assembly 22 or 24 further includes a second rail 38 and a third rail 40. The second rails 38, on which the object 26 is mountable, are each configured to be moved longitudinally with respect to the corresponding first rail 32. Each third rail 40 is movably mounted between the corresponding first rail 32 and the corresponding second rail 38 to increase the distance for which the corresponding second rail 38 can be moved with respect to the corresponding first rail 32.

Referring to FIG. 2 and FIG. 3, the rack system 20 further includes a cable management device 42. The cable management device 42 in this embodiment is located behind the object 26. More specifically, the cable management device 42 includes a first tray 44, a second tray 46, and a first cable chain 48. Preferably, the cable management device 42 further includes a second cable chain 50 and a partition 51. The partition 51, which may be a partition plate, is provided on the first tray 44, divides the first tray 44 into two zones, and thereby separates the first cable chain 48 and the second cable chain 50 from each other.

The first tray 44 is mounted at a fixed position. For example, the first tray 44 is fixedly mounted on the first rails 32. More specifically, the first tray 44 is connected to rear end portions of the first rails 32 via a pair of connecting members 53 respectively. In practice, however, the first tray 44 may be connected to the first rails 32 by fastening or other connection means instead.

Figure 10:
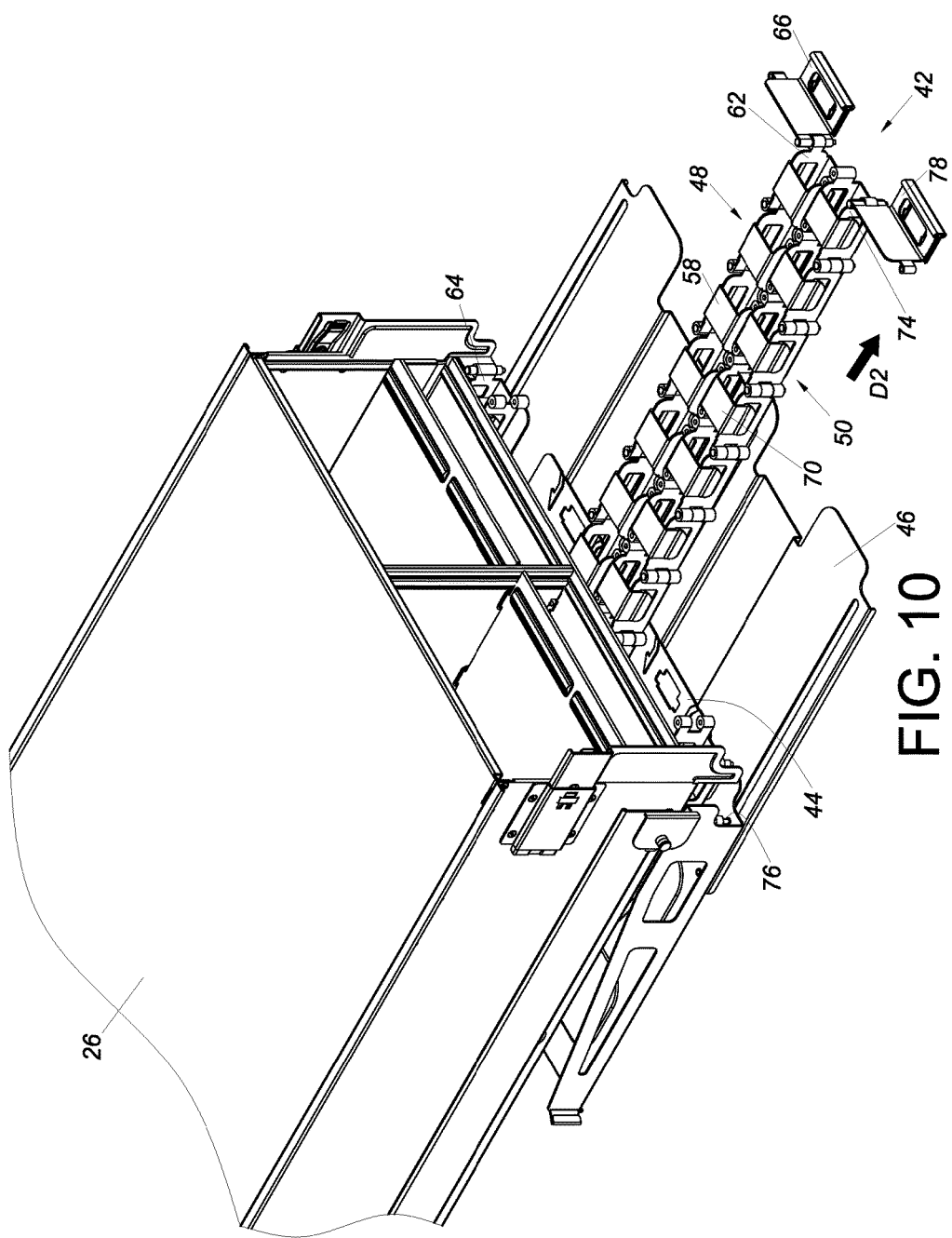
FIG. 10 is a perspective view in which the second tray of the cable management device in the first embodiment of the present invention is in an extended state with respect to the first tray and supports the cable chains.

The second tray 46 is connected to the first tray 44 in such a way that the former can extend and retract with respect to the latter. In this embodiment, one of the first tray 44 and the second tray 46 includes a slot 52 (e.g., a longitudinal slot), and a mounting member 54 extending through a portion of the slot 52 allows the second tray 46 to be moved with respect to the first tray 44 and consequently enter a retracted state (as shown in FIG. 3) or an extended state (as shown in FIG. 10). In this embodiment, the slot 52 has a first edge 56*a* and a second edge 56*b* such that the second tray 46 is movable with respect to the first tray 44 only within a limited range. In practice, however, relative movement between the first tray 44 and the second tray 46 may alternatively be enabled by other structures that are configured to work with each other, such as a long groove and a projection movable in the long groove; the present invention has no limitations in this regard.

The first tray 44 is configured to support the first cable chain 48. More specifically, the first cable chain 48 includes a plurality of cable management units 58 that are movably connected to one another. In this embodiment, the cable management units 58 are pivotally connected to one another and each define a receiving cavity 60 in which cables of the object 26 can be received or placed. Furthermore, the first cable chain 48 includes a first chain section 62 and a second chain section 64. In this embodiment, the first chain section 62 and the second chain section 64 are two opposite end portions by way of example. The first chain section 62 is connected to the first tray 44. For example, the first chain section 62 is detachably connected to the first tray 44 through a first fitting 66 by fastening, mechanical engagement, or other detachable connection methods. The second chain section 64, on the other hand, is connected to the object 26. For example, the second chain section 64 is detachably connected to the object 26 through a first auxiliary member 68 by fastening, mechanical engagement, or other detachable connection methods.

The first tray 44 is also configured to support the second cable chain 50. More specifically, the second cable chain 50 includes a plurality of cable management units 70 that are movably connected to one another. In this embodiment, the cable management units 70 are pivotally connected to one another and each define a receiving cavity 72 in which cables of the object 26 can be received or placed. Furthermore, the second cable chain 50 includes a first chain section 74 and a second chain section 76. In this embodiment, the first chain section 74 and the second chain section 76 are two opposite end portions by way of example. The first chain section 74 is connected to the first tray 44. For example, the first chain section 74 is detachably connected to the first tray 44 through a second fitting 78 by fastening, mechanical engagement, or other detachable connection methods. The second chain section 76, on the other hand, is connected to the object 26. For example, the second chain section 76 is detachably connected to the object 26 through a second auxiliary member 80 by fastening, mechanical engagement, or other detachable connection methods.

The second auxiliary member 80, as shown in FIG. 4, has generally the same structure as the first auxiliary member 68. More specifically, the second auxiliary member 80 as well as the first auxiliary member 68 includes an elastic portion with a first engaging feature 82 (e.g., a hook), and the object 26 includes a second engaging feature 84 (e.g., a wall of a hole) as shown in FIG. 5 on each lateral side. Engagement between the corresponding first engaging feature 82 and second engaging feature 84 (see FIG. 6) provides connection between the second chain section 64 of the first cable chain 48 and the object 26 or connection between the second chain section 76 of the second cable chain 50 and the object 26.

Figure 7:
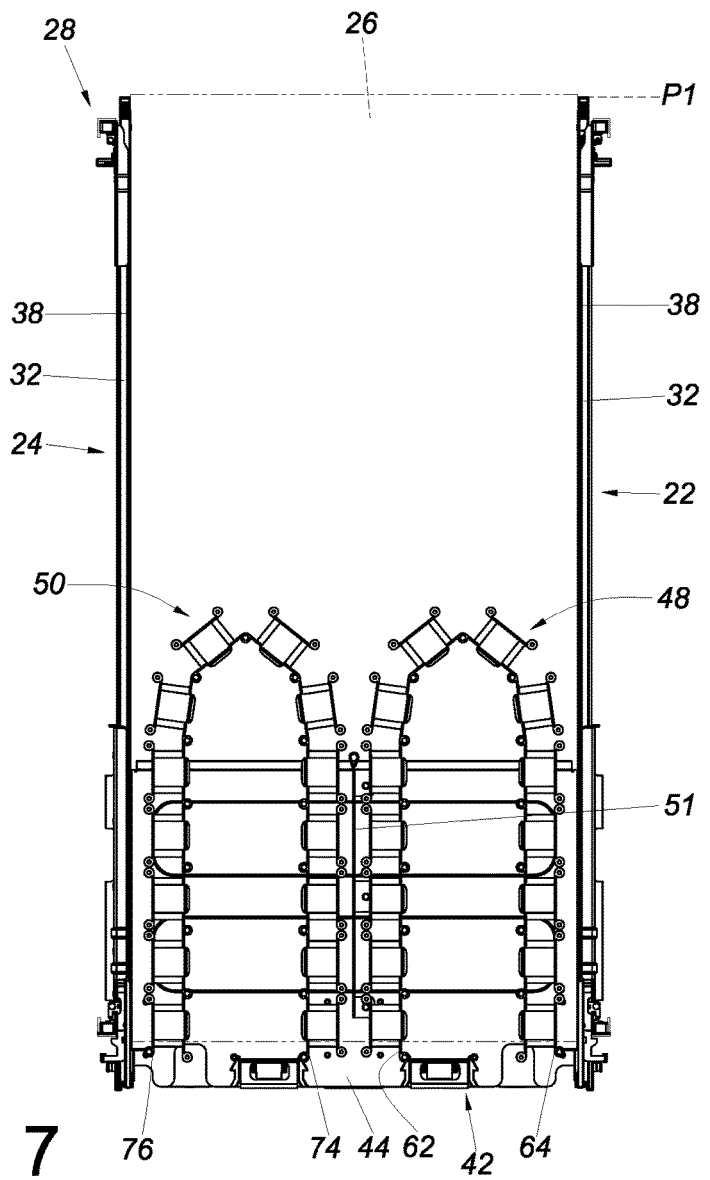
FIG. 7 shows that the slide rail assemblies of the rack system in the first embodiment of the present invention are in a retracted state.

Referring to FIG. 7, the first rails 32 of the side rail assemblies 22 and 24 are mounted on the rack 28, and the two lateral sides of the first tray 44 are mounted on the first rails 32 respectively. The partition 51 lies between the first cable chain 48 and the second cable chain 50. More specifically, the first chain section 62 of the first cable chain 48 and the first chain section 74 of the second cable chain 50 are connected to the first tray 44 while the second chain section 64 of the first cable chain 48 and the second chain section 76 of the second cable chain 50 are connected to the object 26.

When the slide rail assemblies 22 and 24 are in a retracted state, the second rails 38 are retracted, and hence at a first position P1, with respect to the first rails 32, and most of the object 26 is located in the rack 28. On the other hand, the first cable chain 48 and the second cable chain 50 of the cable management device 42 are in a first state (e.g., a retracted state), in which each of the cable chains 48 and 50 has a substantially U-shaped configuration.

Figure 8:
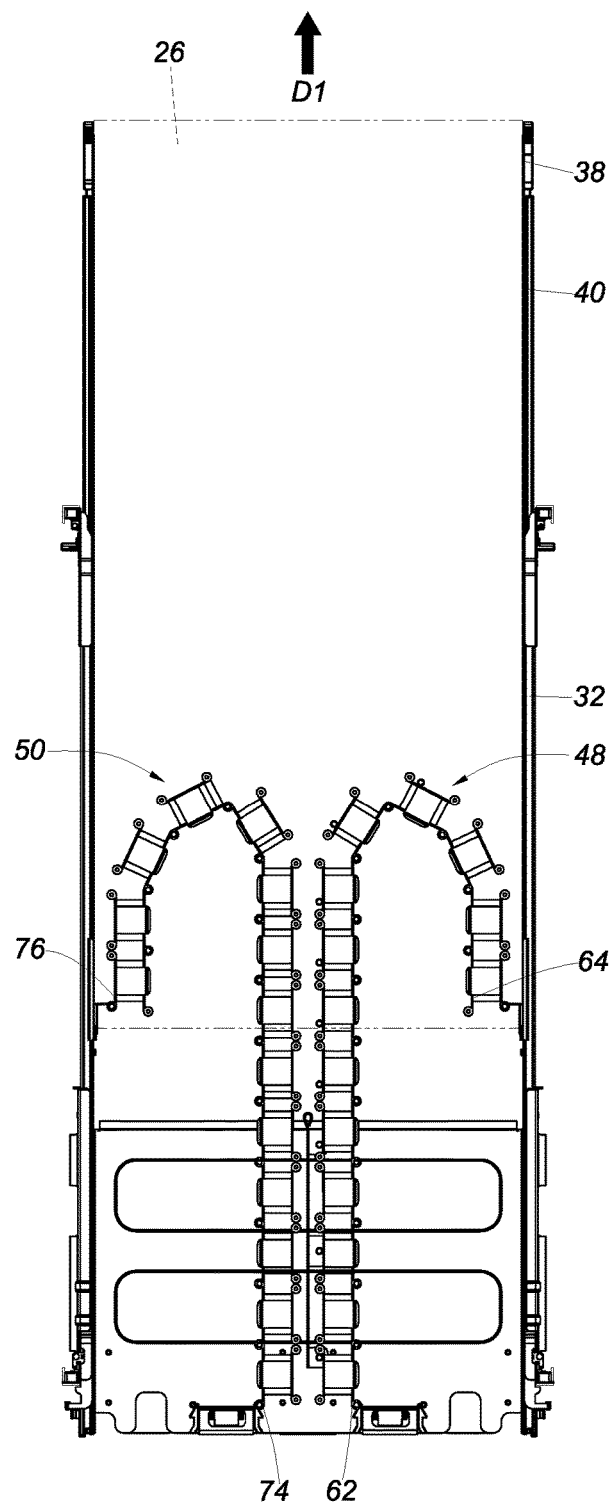
FIG. 8 shows that the second rails of the slide rail assemblies in FIG. 7 are moved in a certain direction with respect to the first rails, and that the first cable chain and the second cable chain of the cable management device are moved as a result.

Referring to FIG. 8 in conjunction with FIG. 7, when the second rails 38 and/or the third rails 40 are longitudinally moved in a first direction D1 (e.g., an extending direction) with respect to the first rails 32 from the first position P1, the object 26 is moved outward of the rack 28 in the first direction D1 along with the second rails 38 and/or the third rails 40. More specifically, in the course in which the second rails 38 are moved in the first direction D1, the second chain section 64 of the first cable chain 48 and the second chain section 76 of the second cable chain 50 are moved in response to the second rails 38 moving in the first direction D1 with respect to the first rails 32 from the first position P1.

In consequence, the second chain section 64 of the first cable chain 48 is gradually moved away from the first chain section 62, and the second chain section 76 of the second cable chain 50 is gradually moved away from the first chain section 74. Little by little, the first cable chain 48 and the second cable chain 50 are brought into a second state (e.g., an extended state).

Figure 9:
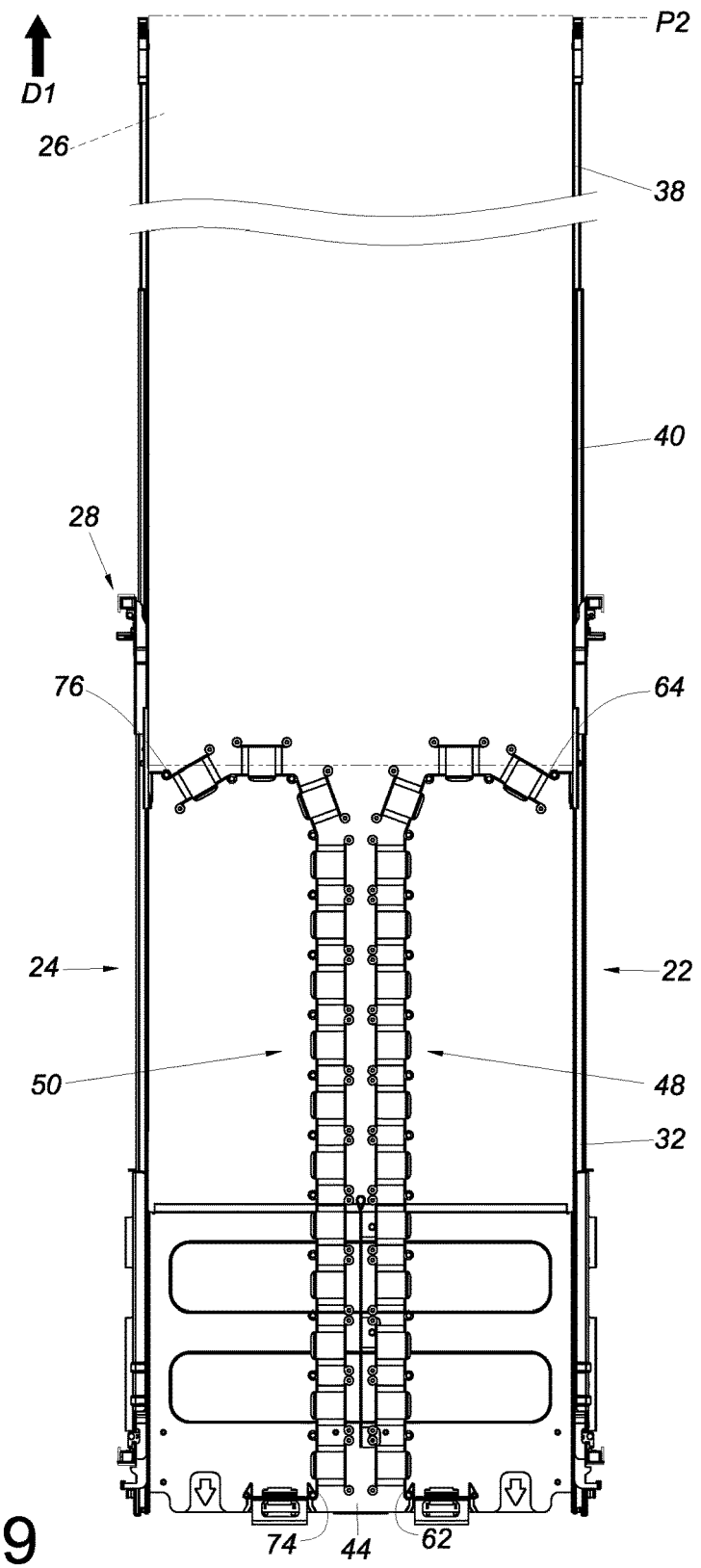
FIG. 9 shows that the second rails of the slide rail assemblies in FIG. 8 are further moved in the same direction with respect to the first rails, and that the first cable chain and the second cable chain of the cable management device are further moved as a result.

Referring to FIG. 9 in conjunction with FIG. 8, when the second rails 38 are further moved in the first direction D1 with respect to the first trails 32 to a second position P2 where the slide rail assembly 22 and 24 are fully extended, most of the object 26 is displaced out of the rack 28 in the first direction D1 along with the slide rail assemblies. In this state, as shown in FIG. 9, the second chain section 64 of the first cable chain 48 is farther away from the first chain section 62 than in FIG. 8, and the second chain section 76 of the second cable chain 50 is farther away from the first chain section 74 than in FIG. 8. The first cable chain 48 and the second cable chain 50 are now in a third state with respect to the first tray 44 (e.g., a fully extended state).

It is worth mentioning that, when the second rails 38 and/or the third rails 40 are subsequently moved in a second direction with respect to the first rails 32 (e.g., a retracting direction, which is the opposite direction of the first direction D1) from the second position P2 back to the first position P1, the first cable chain 48 and the second cable chain 50 return from the third state to the first state (the process of which can be understood by referring to FIG. 7 and hence will not be described herein).

Referring to FIG. 10 in conjunction with FIG. 3, when it is desired to perform maintenance work on the cables of the object 26, the operator applies a force in a certain direction (e.g., the second direction D2) such that the second tray 46 is moved with respect to the first tray 44 from the retracted state to the extended state. The operator then detaches the first fitting 66 (or the second fitting 78) from the first tray 44 and pulls the first chain section 62 of the first cable chain 48 in the second direction D2 with respect to the second chain section 64 (or pulls the first chain section 74 of the second cable chain 50 in the second direction D2 with respect to the second chain section 76). The second tray 46 in the extended state supports the first cable chain 48 (and/or the second cable chain 50). The foregoing arrangement facilitates maintenance of the cables received in the cable management units 58 (or the cable management units 70).

FIG. 11 shows the second embodiment of the present invention. Unlike the cable management device 42 in the first embodiment, which includes only one second tray 46, the cable management device 200 in the second embodiment includes two second trays 202 and 204 for supporting the first cable chain 206 and the second cable chain 208 respectively. Referring to FIG. 12, when it is desired to access only one of the cable chains (e.g., the first cable chain 206) for maintenance, the operator can pull only the second tray 202 outward to the extended state with respect to the first tray 210 so that the first cable chain 206 is supported by the second tray 202 pulled out. This embodiment makes it easier for the operator to perform maintenance work on only the first cable chain 206 when space is limited.

Figure 13:
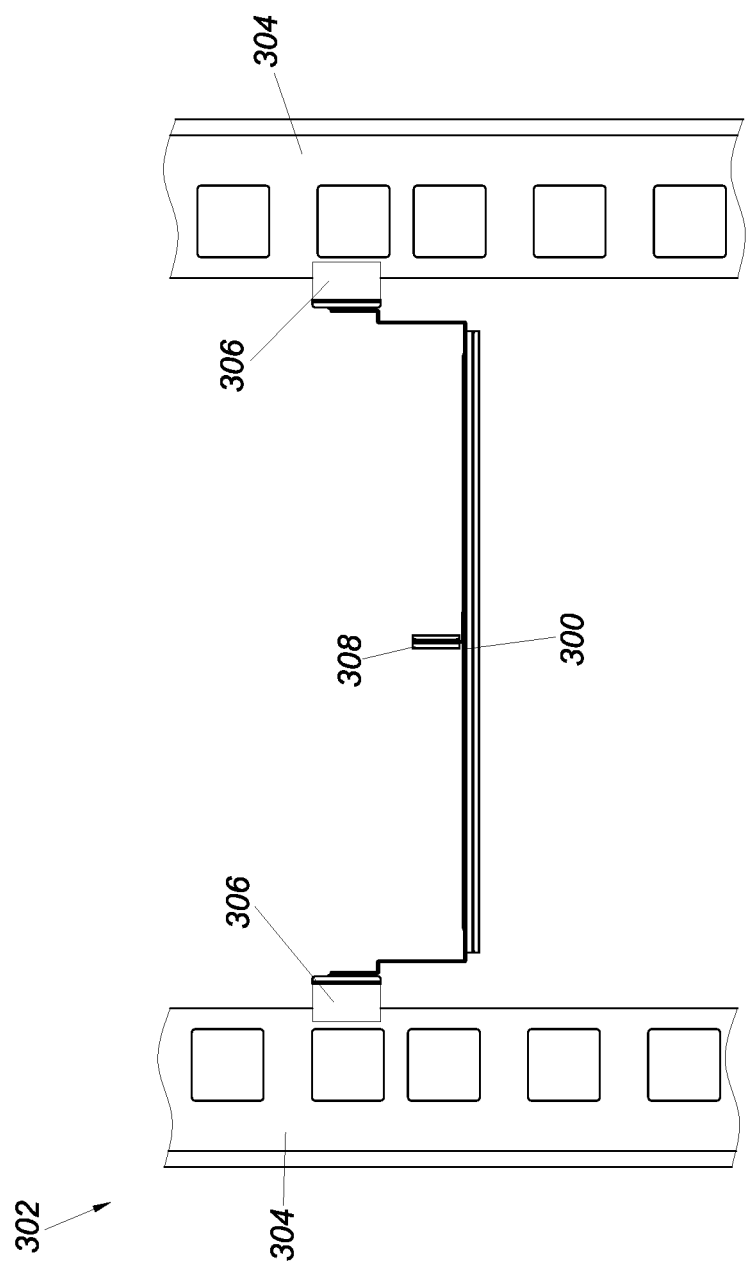
FIG. 13 shows that, in the third embodiment of the present invention, the first tray of the cable management device is mounted on the rack.

FIG. 13 shows the third embodiment of the present invention. Unlike the first tray 44 in the first embodiment, which is mounted on the first rails 32, the first tray 300 in the third embodiment is mounted on the corresponding posts (e.g., the second posts 304) of the rack 302. For example, the first tray 300 is mounted to the posts (e.g., the second posts 304) by threaded connection, mechanical engagement, or additional fittings 306. The partition 308 divides the first tray 300 into two zones, wherein the first cable chain and the second cable chain are respectively placed.

Figure 14:
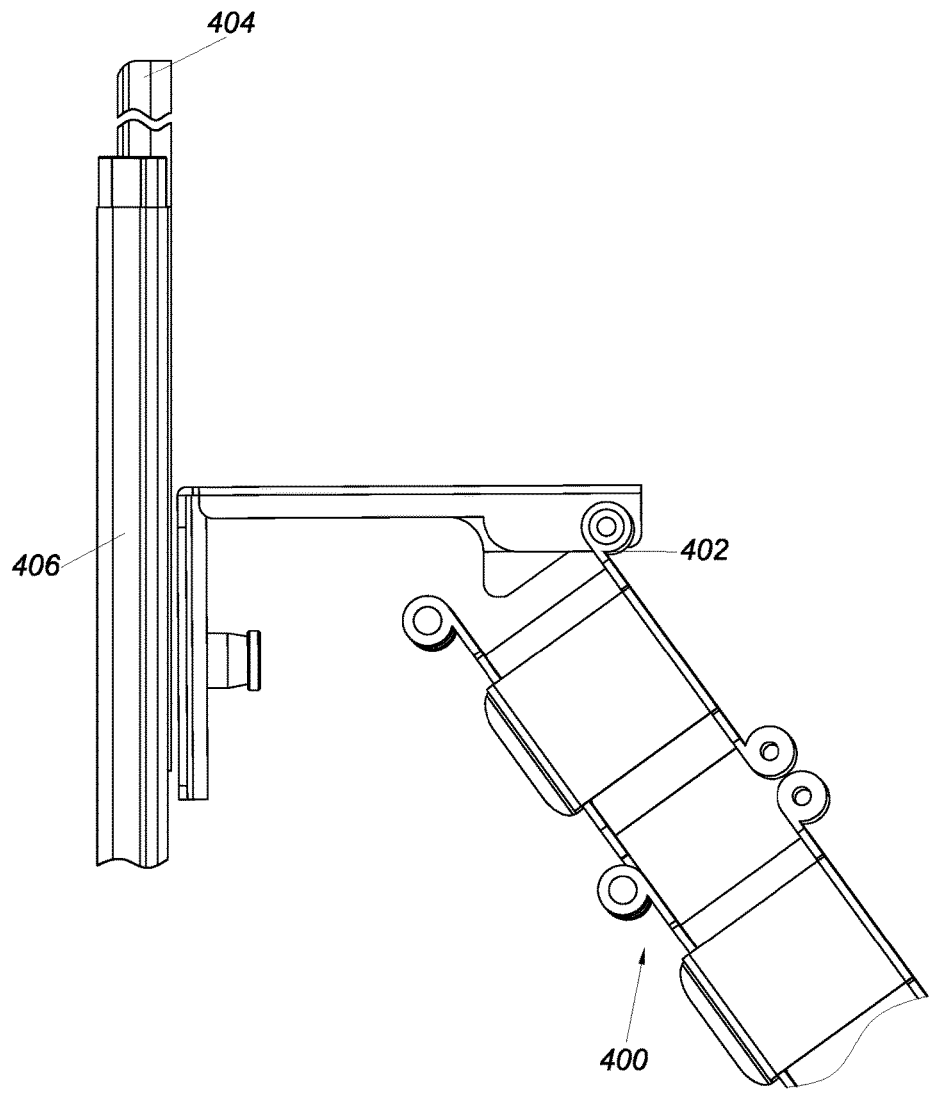
FIG. 14 shows that, in the fourth embodiment of the present invention, each cable chain of the cable management device is connected to the second rail of the corresponding slide rail assembly.

FIG. 14 shows the fourth embodiment of the present invention. Unlike the first embodiment, in which the second chain section 64 of the first cable chain 48 (or the second chain section 76 of the second cable chain 50) is connected to the object 26, the fourth embodiment is so configured that the second chain section 402 of the first cable chain 400 (or of the second cable chain) is connected to the second rail 404. In the fourth embodiment, the second chain section 402 of the first cable chain 400 (or of the second cable chain) is equally capable of moving in response to the second rail 404 moving with respect to the first rail 406, in order to bring the first cable chain 400 (or the second cable chain) from a first state to a second state.

While the present invention has been disclosed through the preferred embodiments described above, it should be understood that the embodiments provided herein are not intended to be restrictive of the scope of the invention. The scope of patent protection sought by the applicant is defined by the appended claims.

What is claimed is:

1. A cable management device for use with a slide rail assembly, comprising:
   a first tray;
   a second tray connected to the first tray in an extendable and retractable manner so as to move with respect to the first tray and thereby enter a retracted state or an extended state;
   a first cable chain connected to the first tray; and
   a second cable chain connected to the first tray.

2. The cable management device of claim 1, wherein the second tray is configured to support the first cable chain while moving with respect to the first tray from the retracted state to the extended state.

3. The cable management device of claim 1, wherein the second tray is configured to support one of the first cable chain and the second cable chain while moving with respect to the first tray from the retracted state to the extended state.

4. The cable management device of claim 1, further comprising a partition on the first tray, wherein the partition keeps the first cable chain and the second cable chain apart.

5. The cable management device of claim 1, wherein the first cable chain includes a plurality of cable management units movably connected to one another.

6. The cable management device of claim 5, wherein the cable management units are pivotally connected to one another.

7. The cable management device of claim 1, wherein the first cable chain is detachably connected to the first tray.

8. A cable management device adapted for a slide rail assembly that includes a first rail and a second rail movable with respect to the first rail, the cable management device comprising:
   a first tray mountable on the first rail of the slide rail assembly;
   a first cable chain connected to the first tray, wherein the first cable chain is moved in response to the second rail moving with respect to the first rail; and
   a second cable chain connected to the first tray.

9. The cable management device of claim 8, further comprising a second tray connected to the first tray in an extendable and retractable manner, wherein the second tray is movable with respect to the first tray in order to enter a retracted state or an extended state.

10. The cable management device of claim 9, wherein the second tray is configured to support the first cable chain while moving with respect to the first tray from the retracted state to the extended state.

11. The cable management device of claim 8, wherein the second tray is configured to support one of the first cable chain and the second cable chain while moving with respect to the first tray from the retracted state to the extended state.

12. The cable management device of claim 8, further comprising a partition on the first tray, wherein the partition keeps the first cable chain and the second cable chain apart.

13. The cable management device of claim 8, wherein the first cable chain includes a plurality of cable management units movably connected to one another.

14. The cable management device of claim 13, wherein the cable management units are pivotally connected to one another.

15. The cable management device of claim 8, wherein the first cable chain is detachably connected to the first tray.

* * * * *